United States Patent
Kim et al.

(10) Patent No.: US 10,177,294 B2
(45) Date of Patent: Jan. 8, 2019

(54) ILLUMINATION APPARATUS

(71) Applicant: LG INNOTEK CO., LTD., Seoul (KR)

(72) Inventors: Min Hak Kim, Seoul (KR); Do Yub Kim, Seoul (KR); Myung Jin Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 62 days.

(21) Appl. No.: 15/297,944

(22) Filed: Oct. 19, 2016

(65) Prior Publication Data

US 2017/0110640 A1  Apr. 20, 2017

(30) Foreign Application Priority Data

Oct. 20, 2015  (KR) .................. 10-2015-0145893

(51) Int. Cl.
  *F21S 8/02*  (2006.01)
  *F21V 29/77*  (2015.01)
  (Continued)

(52) U.S. Cl.
  CPC ............ *H01L 33/644* (2013.01); *F21S 8/026* (2013.01); *F21S 8/06* (2013.01); *F21V 15/01* (2013.01); *F21V 21/0832* (2013.01); *F21V 23/005* (2013.01); *F21V 29/503* (2015.01); *F21V 29/773* (2015.01); *H01L 33/483* (2013.01); *H01L 33/60* (2013.01); *H01L 33/62* (2013.01); *F21Y 2115/10* (2016.08);
  (Continued)

(58) Field of Classification Search
  CPC ...... F21S 8/02–8/028; H01L 25/075–25/0753; H01L 33/64–33/648; F21V 23/003–23/009; F21K 9/23–9/238
  See application file for complete search history.

(56) References Cited

U.S. PATENT DOCUMENTS

2008/0192436 A1    8/2008  Peng et al.
2009/0296414 A1*  12/2009  Moriyama .............. F21S 8/026
                                                              362/373
(Continued)

FOREIGN PATENT DOCUMENTS

DE   10 2010 002 235 A1   8/2011
EP       2 086 294 A2     8/2009
(Continued)

*Primary Examiner* — Mariceli Santiago
(74) *Attorney, Agent, or Firm* — Birch, Stewart, Kolasch & Birch, LLP

(57) ABSTRACT

Embodiments provide an illumination apparatus including a light emitting module including a board, at least one light emitting device disposed in a first region of the board and drive devices disposed in a second region of the board, a heat dissipation member, and dummy pads disposed around the at least one light emitting device, the heat dissipation member including a base, a core, and heat dissipation fins connected to the side surface of the core and the lower surface of the base. The first region is one region of the upper surface of the board, located within a designated range from the center of the board, and the second region is another region of the upper surface of the board, spaced apart from the first region by a first distance and spaced apart from the edge of the upper surface of the board by a second distance.

20 Claims, 7 Drawing Sheets

(51) Int. Cl.
    *F21V 29/503* (2015.01)
    *F21S 8/06* (2006.01)
    *H01L 33/64* (2010.01)
    *H01L 33/48* (2010.01)
    *H01L 33/60* (2010.01)
    *H01L 33/62* (2010.01)
    *F21V 15/01* (2006.01)
    *F21V 23/00* (2015.01)
    *F21V 21/08* (2006.01)
    *F21Y 115/10* (2016.01)
    *H05K 1/02* (2006.01)

(52) U.S. Cl.
    CPC ..... *H05K 1/0209* (2013.01); *H05K 2201/066* (2013.01); *H05K 2201/09781* (2013.01); *H05K 2201/10106* (2013.01)

(56) References Cited

U.S. PATENT DOCUMENTS

| | | | |
|---|---|---|---|
| 2010/0270903 A1* | 10/2010 | Jao | F21V 21/04 313/46 |
| 2010/0277905 A1* | 11/2010 | Janik | F21K 9/00 362/235 |
| 2011/0175536 A1* | 7/2011 | Fujita | F21S 8/02 315/185 R |
| 2012/0241807 A1* | 9/2012 | Hoetzl | F21K 9/00 257/99 |
| 2012/0268929 A1 | 10/2012 | Chung et al. | |
| 2013/0026923 A1* | 1/2013 | Athalye | H05B 33/083 315/113 |
| 2013/0250579 A1 | 9/2013 | Athalye | |
| 2015/0282260 A1* | 10/2015 | Hussell | H05B 33/0806 315/51 |
| 2015/0292686 A1* | 10/2015 | Negley | H05B 37/0272 315/34 |
| 2017/0045188 A1* | 2/2017 | Im | F21V 29/00 |

FOREIGN PATENT DOCUMENTS

| | | |
|---|---|---|
| EP | 2 244 001 A1 | 10/2010 |
| JP | 2009-218204 A | 9/2009 |
| JP | 2012-54181 A | 3/2012 |
| JP | 2012-69487 A | 4/2012 |
| WO | WO 2012/168831 A2 | 12/2012 |

\* cited by examiner

|  | Core size | Temperature of light emitting device [°C] | Temperature of condenser [°C] | Temperature difference between light emitting device and condenser [ΔT] |
|---|---|---|---|---|
| REF | 0 [mm] | 78.82 | 74.72 | 4.1 |
| Case1 | 25 [mm] | 86.33 | 53.84 | 32.49 |
| Case2 | 30 [mm] | 86.34 | 53.85 | 32.49 |
| Case3 | 40 [mm] | 86.31 | 53.89 | 32.42 |
| Case4 | 30 [mm] | 75.14 | 48.38 | 26.76 |
| Case5 | 30 [mm] | 68.20 | 46.6 | 21.6 |
| Case6 | 30 [mm] | 77.50 | 53.40 | 24.1 |

Fig. 11

| | Test Point Temperature (°C) | | | | | | | | | | | | | | | Power consumption (W) | Voltage (V) |
|---|---|---|---|---|---|---|---|---|---|---|---|---|---|---|---|---|---|
| Ts 1 | Ts 2 | L1 | L2 | BR1 | L3 Coil | L3 Core | Q1 | ZD1 | C9 | C10 | U1 (IC) | D/P | Tc 1 | Tc 2 | Outdoor air | | |
| 67.8 | 68.2 | 52.9 | 53.3 | 54.3 | 61.5 | 61.4 | 49.5 | 53.4 | 46.1 | 46.6 | 47.6 | 49.9 | 46.5 | 44.6 | | 10.86 | 120 |
| 68.4 | 68.7 | 56.9 | 57.1 | 57.1 | 61.7 | 61.5 | 50.2 | 53.8 | 46.6 | 47.1 | 48.1 | 49.5 | 46.5 | 45.1 | 25.0 | 11.03 | 100 |
| 67.5 | 67.8 | 51.6 | 51.8 | 53.4 | 61.6 | 61.4 | 49.4 | 53.1 | 45.9 | 46.5 | 47.3 | 50.3 | 45.9 | 44.3 | | 10.78 | 132 |

Fig. 12

| | Test Point Temperature (°C) | | | | | | | | | | | | | | | Power consumption (W) | Voltage (V) |
|---|---|---|---|---|---|---|---|---|---|---|---|---|---|---|---|---|---|
| Ts 1 | Ts 2 | L1 | L2 | BR1 | L3 Coil | L3 Core | Q1 | ZD1 | C9 | C10 | U1 (IC) | D/P | Tc 1 | Tc 2 | Outdoor air | | |
| 77.0 | 77.5 | 59.1 | 60.7 | 60.9 | 64.2 | 65.8 | 57.8 | 61.7 | 52.9 | 53.4 | 55.5 | 44.8 | 54.3 | 51.9 | 25.0 | 10.86 | 120 |

ILLUMINATION APPARATUS

CROSS REFERENCE TO RELATED APPLICATION

This application claims priority under 35 U.S.C. § 119 to Korean Patent Application No. 10-2015-0145893, filed in Korea on Oct. 20, 2015, which is hereby incorporated in its entirety by reference as if fully set forth herein.

TECHNICAL FIELD

Embodiments relate to an illumination apparatus.

BACKGROUND

In general, an illumination apparatus including an LED light emitting module driven by AC may include a plurality of LEDs disposed on a substrate and at least one drive device (for example, a driver IC, a bridge diode and a condenser) disposed adjacent to the LEDs.

A light source of the LED light emitting module may be a package type and, in this case, heat dissipation efficiency may be poor and costs may be increased. Further, the drive devices disposed adjacent to the LEDs absorb light and thus light loss may occur.

Further, heat generated from the LEDs may thermally damage the drive devices disposed adjacent to the LEDs.

SUMMARY

Embodiments provide an illumination apparatus which may prevent lifetime of drive devices from being shortened due to heat generated from light emitting devices.

In one embodiment, an illumination apparatus includes a light emitting module including a board, at least one light emitting device disposed in a first region of the board, and drive devices disposed in a second region of the board so as to drive the at least one light emitting device, a heat dissipation member disposed on a lower surface of the board, and dummy pads disposed in a region of the board around the at least one light emitting device, wherein the heat dissipation member includes a base corresponding to the lower surface of the board, a core connected to a lower surface of the base, and heat dissipation fins connected to a side surface of the core and the lower surface of the base, wherein the first region is one region of an upper surface of the board, including a center of the upper surface of the board and located within a designated range from the center of the upper surface of the board, and the second region is another region of the upper surface of the board, spaced apart from the first region by a first distance and spaced apart from an edge of the upper surface of the board by a second distance.

The at least one light emitting device may include a plurality of light emitting devices, and the dummy pads may surround outermost light emitting devices out of the light emitting devices.

The dummy pads may be disposed in the first region of the board.

The dummy pads may be disposed both in the first region of the board and in a region located between the first region and the second region of the board.

A distance between the dummy pads and the second region of the board may be 14 mm or more.

The first distance may be greater than the second distance.

An area of each of the dummy pads may be greater than an area of a light emitting surface of each of the light emitting devices.

A ratio of a diameter of the core to a diameter of the first region of the board may be 5/6 to 4/3.

The illumination may further include a heat dissipation pad disposed between the lower surface of the board and the base of the heat dissipation member and a housing configured to receive the light emitting module and the heat dissipation pad.

The housing may include a first opening corresponding to the first region of the board, a second opening configured to emit light generated from the at least one light emitting device, and a reflective part including a reflective surface located between the first opening and the second opening, and the reflective surface may be located between the drive devices and the at least one light emitting device.

The illumination apparatus may further include a diffusion plate disposed on the second opening.

A center of the core may be aligned with the center of the first region of the board.

The board may include pads to dispose the light emitting devices thereon, and the dummy pads may contact the pads.

The board may include pads to dispose the light emitting devices thereon, and the dummy pads may be separated from the pads.

The upper surface of the base may include a first region corresponding to the board such that the board is disposed thereon and a second region configured to surround the first region, through holes may be provided in the second region of the base, and coupling members may pass through the through holes and be combined with the lower end of the housing.

One end of each of the heat dissipation fins may be connected to the side surface of the core, and the other end of each of the heat dissipation fins may extend to an edge of the lower surface of the base.

A thickness of the core may be greater than a thickness of the base.

The center of the core may be aligned with the center of the base.

In another embodiment, an illumination apparatus includes a light emitting module including a board, light emitting devices disposed in a first region of the board, drive devices disposed in a second region of the board so as to drive the light emitting devices, and dummy pads disposed on an upper surface of the board between the light emitting devices and the drive devices, and a heat dissipation member including a base provided with an upper surface contacting a lower surface of the board, a core connected to a lower surface of the base, and heat dissipation fins connected to the side surface of the core and a lower surface of the base, wherein the first region is one region of the upper surface of the board, including a center of the upper surface of the board and located within a designated range from the center of the upper surface of the board, and the second region is another region of the upper surface of the board, spaced apart from the first region and an edge of the upper surface of the board.

In yet another embodiment, an illumination apparatus includes a light emitting module including a board, light emitting devices disposed in a first region of the board, drive devices disposed in a second region of the board so as to drive the light emitting devices, and dummy pads disposed on an upper surface of the board between the light emitting devices and the drive devices, a heat dissipation member including a base provided with an upper surface contacting the lower surface of the board, a core connected to the lower surface of the base, and heat dissipation fins connected to a side surface of the core and a lower surface of the base, a heat dissipation pad disposed between a lower surface of the board and the base, and a housing configured to receive the light emitting module and the heat dissipation pad, wherein the dummy pads surround outermost light emitting devices out of the light emitting devices, the first region is one region of the upper surface of the board, including the center of the upper surface of the board and located within a designated range from the center of the board, and the second region is another region of the upper surface of the board, spaced apart from the first region and an edge of the upper surface of the board.

BRIEF DESCRIPTION OF THE DRAWINGS

Arrangements and embodiments may be described in detail with reference to the following drawings in which like reference numerals refer to like elements and wherein:

FIG. 11 is a table representing test results of Case 4 of FIG. 10; and

FIG. 12 is a table representing test results of Case 6 of FIG. 10.

DESCRIPTION OF SPECIFIC EMBODIMENTS

Figure 1:
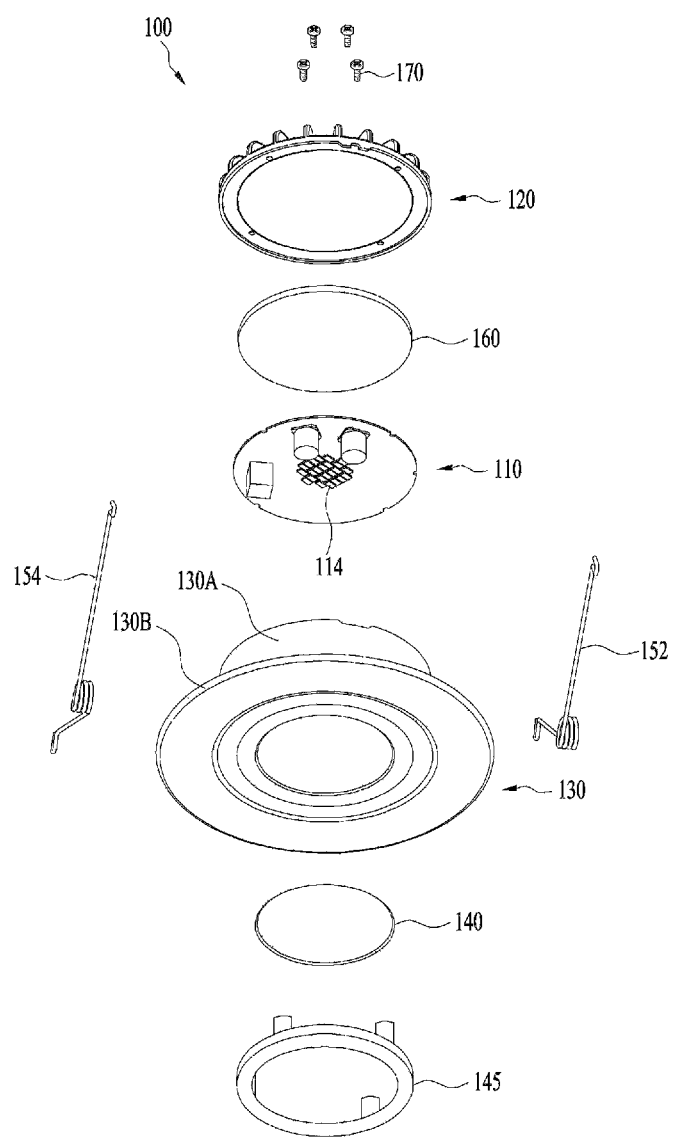
FIG. 1 is an exploded perspective view of an illumination apparatus in accordance with one embodiment.

Hereinafter, embodiments will be described with reference to the annexed drawings. In the following description of the embodiments, it will be understood that, when each element, such as a layer (film), a region, a pattern or a structure, is referred to as being "on" or "under" another element, such as a substrate, a layer (film), region, a pattern or a pad, it can be directly "on" or "under" the other element or be indirectly formed with one or more intervening elements therebetween. In addition, it will also be understood that a criteria to determine an upward direction and a downward direction of one element is judged based on the drawings.

In the drawings, thicknesses or sizes of respective layers may be exaggerated, omitted, or schematically illustrated for convenience and clarity of description. Further, the sizes of respective elements do not indicate actual sizes thereof. In the drawings, the same or similar elements are denoted by the same reference numerals even though they are depicted in different drawings.

Figure 2:
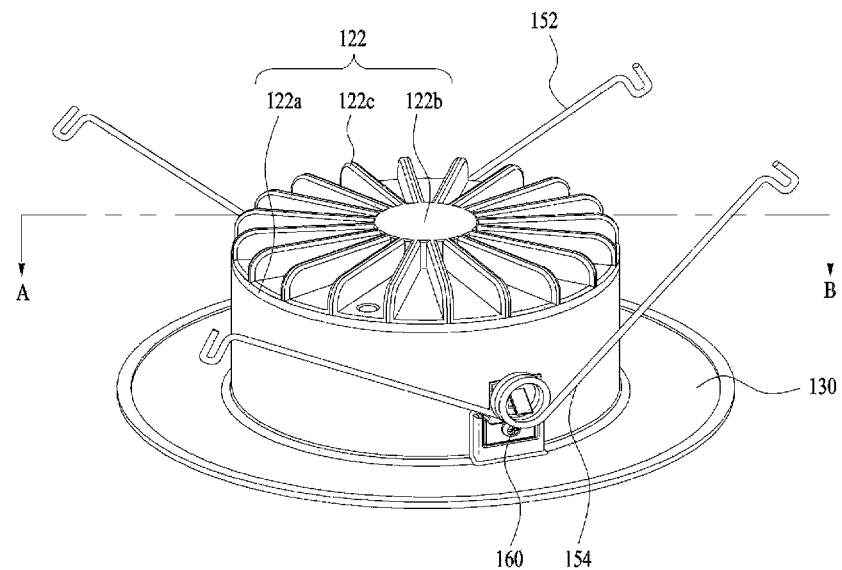
FIG. 2 is a first assembled perspective view of the illumination apparatus shown in FIG. 1.
Figure 3:
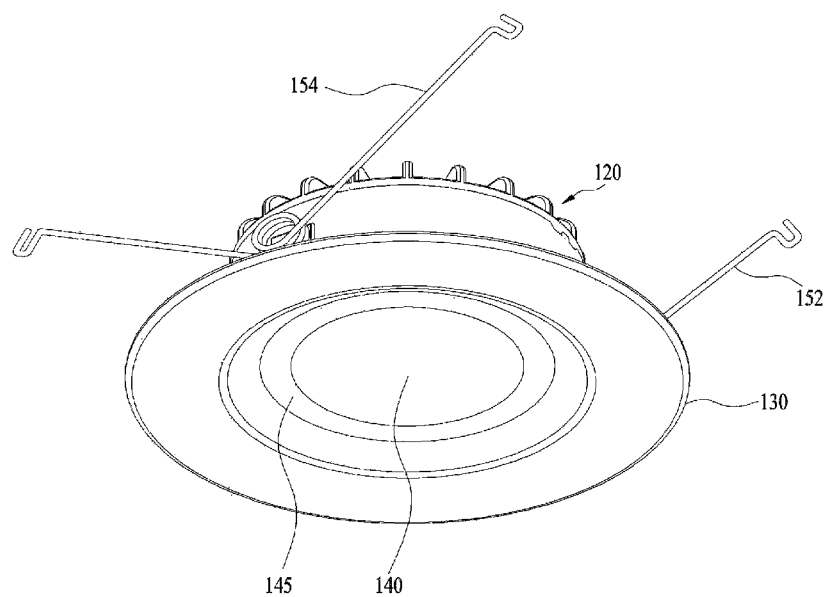
FIG. 3 is a second assembled perspective view of the illumination apparatus shown in FIG. 1.
Figure 4:
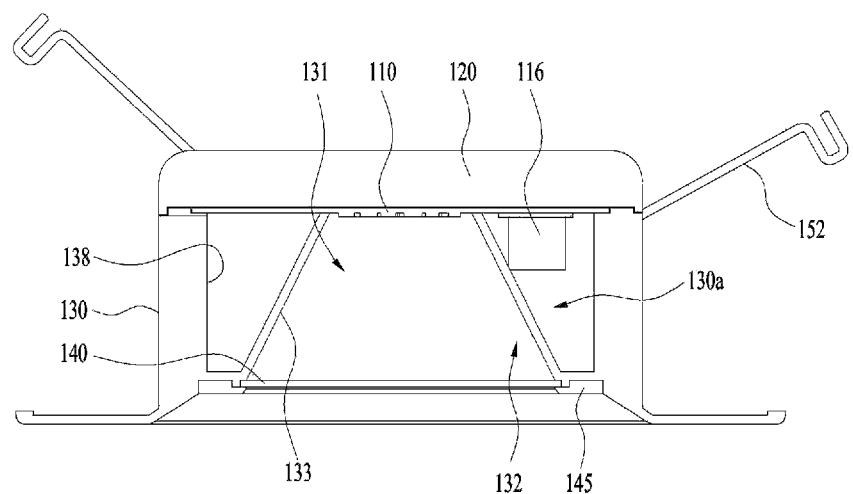
FIG. 4 is a cross-sectional view of the illumination apparatus shown in FIG. 2, taken along line A-B.

FIG. 1 is an exploded perspective view of an illumination apparatus 100 in accordance with one embodiment, FIG. 2 is a first assembled perspective view of the illumination apparatus 100 shown in FIG. 1, FIG. 3 is a second assembled perspective view of the illumination apparatus 100 shown in FIG. 1, and FIG. 4 is a cross-sectional view of the illumination apparatus 100 shown in FIG. 2, taken along line A-B.

With reference to FIGS. 1 to 4, an illumination apparatus 100 includes a light emitting module 110, a heat dissipation member 120, a housing 130, and a diffusion plate 140.

The light emitting module 110 emits light.

Figure 5A:
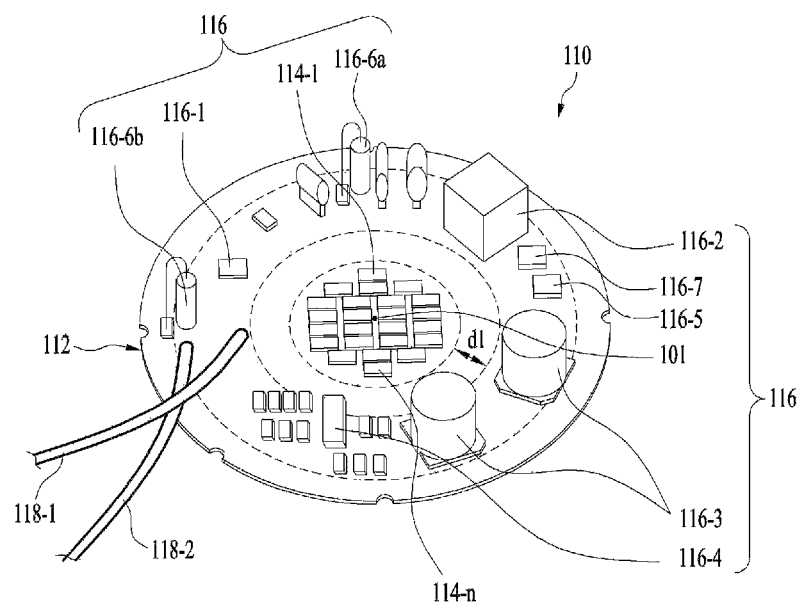
FIG. 5A is a perspective view of a light emitting module shown in FIG. 1 in accordance with one embodiment.

FIG. 5A is a perspective view of the light emitting module 110 shown in FIG. 1 in accordance with one embodiment. With reference to FIG. 5A, the light emitting module 110 may include a board 12, at least one light emitting device 114, and drive devices 116.

The board 112 may be formed of a material, such as silicon, a synthetic resin or a metal.

For example, the board 112 may be formed of a conductive material which greatly dissipates heat, such as Al, and, in order to prevent electrical short-circuit between the at least one light emitting device 114 and the drive devices 116, the surface of the board 112 may be coated with an insulating layer (not shown).

Further, for example, the board 112 may include a printed circuit board which may conductibly connect the at least one light emitting device 114 and the drive devices 116.

For example, the board 112 may be a printed circuit board including an FR4 or CEM-1 PCB.

The at least one light emitting device 114 and the drive devices 116 are disposed on an upper surface 112a of the board 112.

For example, the at least one light emitting device 114 may be a light emitting diode which emits light, and be formed as a chip type or a package type.

Figure 5B:
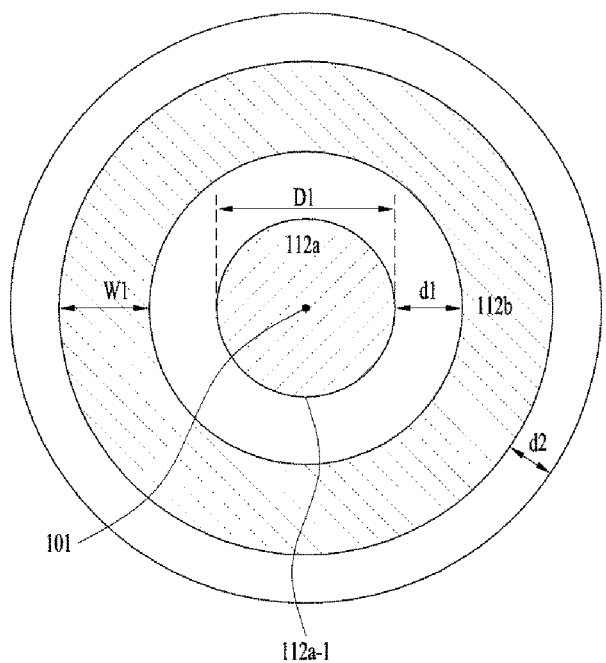
FIG. 5B is a view illustrating regions in which at least one light emitting device and drive devices shown in FIG. 5A are located.

FIG. 5B is a view illustrating regions 112a and 112b in which the at least one light emitting device 114 and the drive devices 116 shown in FIG. 5A are located.

With reference to FIG. 5B, the upper surface 112a of the board 112 may include first and second regions 112a and 112b.

The at least one light emitting device 114 may be disposed in the first region 112a of the board 112, and the drive devices 116 may be disposed in the second region 112b of the board 112.

The first region 112a of the board 112 may be a central region of the upper surface 112a of the board 112, including the center 101 of the board 112 and located within a designated range from the center 101 of the board 112. For example, the first region 112a of the board 112 may have a circular shape, an oval shape or a polygonal shape.

The second region 112b of the board 112 may be spaced apart from the first region 112a of the board 112 by a first distance d1 and be spaced from the edge of the upper surface 112a of the board 112 by a second distance d2. For example, the second region 112b of the board 112 may have a ring shape or a circular, oval or polygonal band shape, but the disclosure is not limited thereto.

For example, the second region 112b of the board 112 may have a circular ring shape with a designated width.

For example, in consideration of the number of light emitting devices disposed in the first regions 112a, the diameter D1 of the first region 112a of the board 112 may be 25 mm to 35 mm. For example, the diameter D1 of the first region 112a of the board 112 may be 30 mm.

For example, the width W1 of the second region 112b of the board 112 may be 15 mm to 20 mm.

For example, the width W1 of the second region 112b of the board 112 may be 17.5 mm.

The diameter D1 of the first region 112a of the board 112 may be greater than the width W1 of the second region 112b of the board 112 (D1>W1).

The first distance d1 may be greater than the second distance d2 (d1>d2). The reason for this is to elongate a transmission path of heat generated from the at least one light emitting device 114 to the drive devices 116 by increasing the distance d1 between the drive devices 116 and the at least one light emitting device 114 and thus to suppress rise of the temperature of the drive devices 116 to improve lifetime of the drive devices 116.

The first distance d1 may be 10 mm to 15 mm. For example, the first distance d1 may be 12 mm.

The second distance d2 may be 3 mm to 7 mm. For example, the second distance d2 may be 5 mm.

The at least one light emitting device 114 may be a plurality of light emitting devices 114. If a plurality of light emitting devices 114 is provided, the light emitting devices 114-1 to 114-$n$ (n being a natural number of greater than 1; n>1), which are spaced apart from each other, may be disposed in the first region 112a of the board 112.

The light emitting devices 114-1 to 114-$n$ may be connected in series, but the disclosure is not limited thereto. In other embodiments, the light emitting devices 114-1 to 114-$n$ may be connected in parallel or connected in serial-parallel.

The drive devices 116 may drive the light emitting devices 114-1 to 114-$n$ using AC power. For example, the drive devices 116 may rectify the AC power, convert the AC power into DC power, and provide the DC power to the light emitting devices 114-1 to 114-$n$.

For example, the drive devices 116 may include a power supply unit to provide direct current to the light emitting devices 114-1 to 114-$n$.

For example, the drive devices 116 may include a bridge diode 116-1, a voltage converter 116-2, condensers 116-3, a driver IC 116-4, a Zener diode 116-5, resistors 116-6a and 116-6b, etc. Further, the drive devices 116 may further include an inductor, an output diode, and an FET 116-7.

The bridge diode 116-1 rectifies AC power.

The condensers 116-3 and the resistors 116-6a and 116-6b may constitute a smoothing circuit and convert the rectified AC power into DC power.

The voltage converter 116-2 converts voltage of the DC power of the smoothing circuit so as to match operating voltage of the at least one light emitting device 114. The driver IC 116-4 may control operation of the at least one light emitting device 114. The Zener diode 116-5 may protect the at least one light emitting device 114 and the drive devices 116 from surge introduced from the outside.

The heat dissipation member 120 is disposed on the lower surface of the board 112 of the light emitting module 110 and dissipates heat generated from the at least one light emitting device 114.

Figure 6:
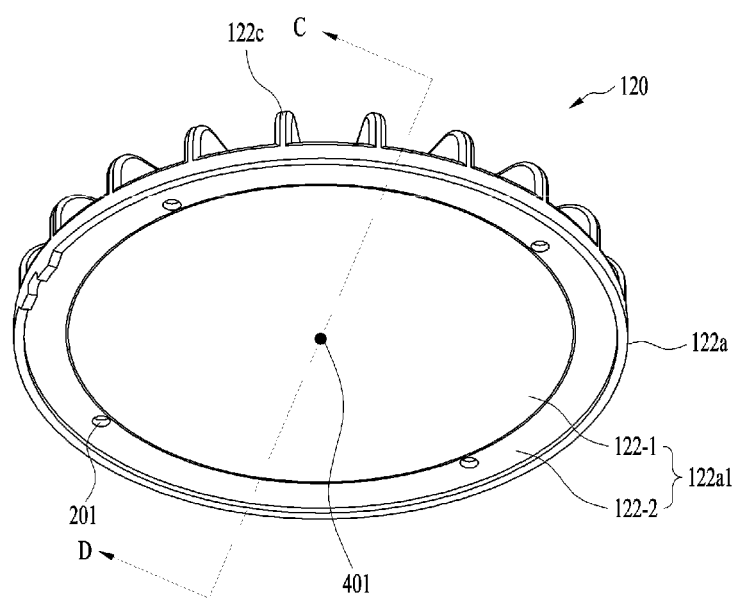
FIG. 6 is a first perspective view of a heat dissipation member shown in FIG. 1.
Figure 7:
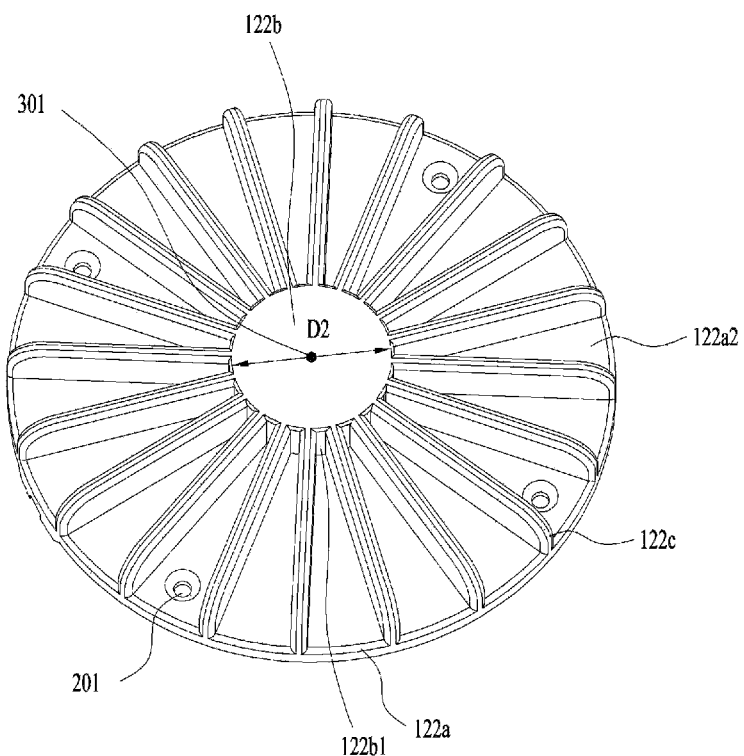
FIG. 7 is a second perspective view of the heat dissipation member shown in FIG. 1.
Figure 8:
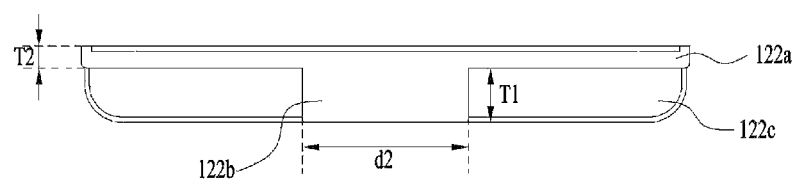
FIG. 8 is a cross-sectional view of the heat dissipation member shown in FIG. 6, taken along line C-D.

FIG. 6 is a first perspective view of a heat dissipation member 120 shown in FIG. 1, FIG. 7 is a second perspective view of the heat dissipation member 120 shown in FIG. 1, and FIG. 8 is a cross-sectional view of the heat dissipation member 120 shown in FIG. 6, taken along line C-D.

With reference to FIGS. 6 to 8, the heat dissipation member 120 may include a base 122a, a core 122b, and heat dissipation fins 122c.

The base 122a may have a plate shape corresponding to the board 112 and be formed of a metal having high thermal conductivity, for example, aluminum (Al). For example, the base 122a may have a shape coinciding with the shape of the board 112 and have a uniform thickness. For example, the base 122a may have a circular shape, an oval shape or a polygonal shape, but the disclosure is not limited thereto.

An upper surface 122a1 of the base 122a is located opposite the lower surface of the board 112, and the upper surface 122a1 of the base 122a and the lower surface of the board 112 may contact each other. The board 112 of the light emitting module 110 may be disposed on the upper surface 122a1 of the base 122a. Through holes 201, through which coupling members 170 for coupling with the housing 130 pass, may be formed through the base 122a. The coupling members 170 may pass through the through holes 201 and be coupled with the lower end of a first part 130A of the housing 130.

For example, the upper surface 122a1 of the base 122a may include a first region 122-1 corresponding to the board 112 such that the board 112 is seated or disposed in the first region 122-1, and a second region 122-2 formed at the edge of the upper surface 122a1 so as to surround the first region 122-1.

For example, the number of the through holes 201 may be more than 2, and 2 or more through holes 201 may be disposed in the second region 122-2 of the base 122a so as to be spaced apart from each other. As exemplarily shown in FIG. 7, the through holes 201 may be located between the heat dissipation fins 122c or be aligned between the heat dissipation fins 122c.

If the through holes 201 are disposed in the first region 122-1 of the base 122a, a contact area between the upper surface 122a of the base 122a and the lower surface of the board 112 is reduced and thus heat dissipation efficiency may be lowered. Therefore, in accordance with this embodiment, the through holes 201 are disposed in the second region 122-2 of the base 122a and thus heat dissipation efficiency may be improved.

The core 122b is connected to a rear or lower surface 122a2 of the base 122a and is located so as to correspond to or to be aligned with the first region 112a of the board 112. Heat generated from the light emitting devices 114-1 to 114-$n$ located in the first region 112a is dissipated through the core 122b, thus improving heat dissipation efficiency. The core 122b may mean a core part for heat dissipation and "core" may be replaced with other terms such as heat sink, heat dissipation part, heat dissipation central part, protruding part, or core part.

For example, a center 301 of the core 122b may be aligned with a center 401 of the base 122a. Further, for example, the center 301 of the core 122b may be aligned with a center 101 of the first region 112a of the board 112. Thereby, an overlap area of the first region 112a of the board 112 with the core 122b may be increased and, in this embodiment, light dissipation efficiency may be improved.

The heat dissipation fins 122c may be connected to a side surface 122b1 of the core 122b and the lower surface 122a2 of the base 122a, and dissipate heat transmitted from the core 122b.

Since the heat dissipation fins 122c contact both the side surface 122b1 of the core 122b and the lower surface 122a2 of the base 122a, in this embodiment, a contact area of the heat dissipation fins 122c with the base 122a and the core 122b is increased and thus heat dissipation efficiency may be increased.

For example, the heat dissipation fins 122c may have a plate shape, be provided in plural, and be arranged in a radial shape about the core 122b.

One end of each of a plurality of heat dissipation fins 122c may be connected to the side surface 122b1 of the core 122b, and the upper surfaces of the heat dissipation fins 122c may be connected to the lower surface 122a2 of the base 122c.

The other ends of the heat dissipation fins 122c may extend to the edge of the lower surface 122a2 of the base 122a and contact the edge of the lower surface 122a2 of the base 122a. Therefore, in this embodiment, a contact area between the heat dissipation fins 122c and the base 122a is increased and thus heat dissipation efficiency may be increased.

In order to improve heat dissipation efficiency, the thickness T1 of the core 122b is greater than the thickness T2 of the base 122a. Here, the thickness T1 of the core 122b may be a distance from the upper end of the core 122b connected to the lower surface 122a2 of the base 122a to the lower end of the core 122b.

Since the core 122b is aligned with the first region 112a of the board 112 in which the light emitting devices 114-1 to 114-n are located and the thickness T1 of the core 122b is greater than the thickness T2 of the base 112a, heat generated from the light emitting devices 114-1 to 114-n may be effectively transmitted to the heat dissipation fins 122c through the core 122b and thus heat dissipation efficiency may be improved. For example, the thickness T1 of the core 122b may be twice or more the thickness T2 of the base 112 (T1≤2×T2).

The illumination apparatus 100 may further include a heat dissipation pad 160 disposed between the board 112 of the light emitting module 110 and the heat dissipation member 120. The heat dissipation pad 160 may be an insulating member which may improve heat transfer from the light emitting devices 114 to the heat dissipation member 120.

The housing 130 may include a first part 130A connected to the heat dissipation member 120 and receiving the light emitting module 110 and the heat dissipation pad 160, and a second part 130B connected to one end of the first part 130A and including a protrusion protruding in the side direction. The housing 130 may be formed of a metal or plastic.

The first part 130A of the housing 130 may include a first opening 131, a second opening 132, and a reflective part 130a including a reflective surface 133 between the first opening 131 and the second opening 132.

The first opening 131 may be provided at one end of the reflective surface 133, correspond to or be aligned with the first region 112a of the board 112, and expose the light emitting devices 114-1 to 114-n.

The reflective surface 133 of the housing 130 may reflect light irradiated from the light emitting devices 114-1 to 114-n. The reflective surface 133 may be inclined at a designated angle from the upper surface of the board 112.

The second opening 132 of the housing 130 is provided at the other end of the reflective surface 133. The diameter of the second opening 132 may be greater than the diameter of the first opening 131, but the disclosure is not limited thereto. For example, the reflective surface 133 of the housing 130 may have a circular truncated conical shape, but the disclosure is not limited thereto.

A vacant space may be provided between the side part and the reflective part 130a of the housing 130, and the drive devices 116 may be disposed between an inner surface 138 of the side part of the housing 130 and the outer surface of the reflective part 130a.

Since the reflective surface 133 of the reflective part 130a are located between the drive devices 116 and the light emitting devices 114-1 to 114-n and the reflective surface 133 reflects light irradiated from the light emitting devices 114-1 to 114-n, the reflective part 130a may prevent the drive devices 116 from absorbing light and luminous efficiency of the illumination apparatus 100 may be improved.

The diffusion plate 140 may be disposed on the housing 140 and diffuses light irradiated from the light emitting devices 114-1 to 114-n. For example, the diffusion plate 140 may be disposed so as to cover the second opening 132 of the housing 130.

The illumination apparatus 100 may further include a diffusion plate fixing part 145 to fix the diffusion plate 140 to the housing 130.

The illumination apparatus 100 may further include support parts 152 and 154 combined with the housing 130 to support the housing 130.

For example, the support parts 152 and 154 may be combined with the outer surface of the side part of the housing 130 by coupling members, such as screws. The support parts 152 and 154 may have a wire shape, without being limited thereto, and both ends of the support parts 152 and 154 may be bent to form a hook to be hung on protrusions. Here, the protrusions may be provided in a place or an object, in or to which the illumination apparatus 100 is installed or fixed.

Figures 9, 10:
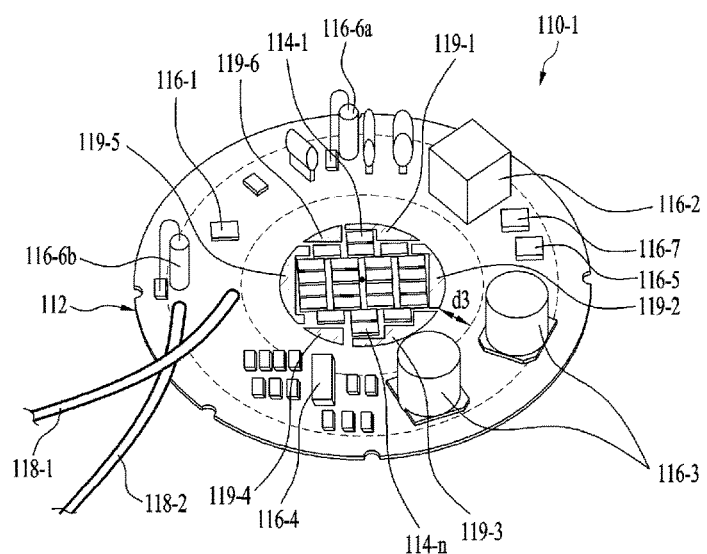
FIG. 9 is a perspective view of a light emitting module in accordance with another embodiment.
FIG. 10 is a table representing simulation results and test results indicating temperatures of light emitting devices, temperatures of condensers and temperature differences between the light emitting devices and the condensers according to change of diameters of cores.

FIG. 9 is a perspective view of a light emitting module 110-1 in accordance with another embodiment. Some parts in this embodiment, which are substantially the same as those in the embodiment shown in FIG. 5A, are denoted by the same reference numerals even though they are depicted in different drawings, and a detailed description thereof will thus be omitted because it is considered to be unnecessary.

With reference to FIG. 9, the light emitting module 110-1 may include light emitting devices 114-1 to 114-n (n being a natural number of greater than 1; n>1), dummy pads 119-1 to 119-6, and drive devices 116.

The dummy pads 119-1 to 119-6 may be disposed in one region of a board 112, which is located between the light emitting devices 114-1 to 114-n and the drive devices 116.

The dummy pads 119-1 to 119-6 are disposed in a first region 112a of the board 112 around the light emitting devices 114-1 to 114-n, and serve to suppress transfer of heat generated from the light emitting devices 114-1 to 114-n to the drive devices 116.

For example, as exemplarily shown in FIG. 9, the dummy pads 119-1 to 119-6 may be disposed between the light emitting devices 114-1 to 114-n disposed at the outermost area of the first region 112a and an outermost line 112a-1 (with reference to FIG. 5B) of the first region 112a.

Since the dummy pads 119-1 to 119-6 are disposed adjacent to the light emitting devices 114-1 to 114-n, transfer of heat to the drive devices 116 may be suppressed. Further, since the dummy pads 119-1 to 119-6 are disposed in the first region 112a of the board 112 corresponding to a core 122b, heat generated from the light emitting devices 114-1 to 114-n may be rapidly discharged to the outside through the core 122b and thus heat dissipation efficiency may be improved.

Further, for example, differently from FIG. 9, in accordance with another embodiment, dummy pads may be disposed both in a first region 112a of a board and in a region located between the first and second regions 112a and 112b of the board 112. The reason for this is to increase the size or area of the dummy pads so as to further improve heat dissipation efficiency.

The dummy pads 119-1 to 119-6 may be formed of a material having high thermal conductivity, for example, aluminum (Al), copper (Cu), etc.

The dummy pads 119-1 to 119-6 may be connected to or contact a conductive layer, pads, electrodes or lead frames provided on the board 112 so as to mount the light emitting devices 114-1 to 114-n thereon, but the disclosure is not limited thereto.

Otherwise, in accordance with another embodiment, the dummy pads 119-1 to 119-6 may be separated from a conductive layer, pads, electrodes or lead frames provided on the board 112 so as to mount the light emitting devices 114-1 to 114-n thereon.

For example, in order to suppress heat transfer to the drive devices 116, the dummy pads 119-1 to 119-6 may be disposed to surround the light emitting devices located in the outermost area among the light emitting devices 114-1 to 114-n. Although FIG. 9 illustrates 6 dummy pads, without being limited thereto, the number of the dummy pads may be 2 or more.

Further, in order to suppress heat transfer and to improve heat dissipation efficiency, the area of the upper or lower surface of each of the dummy pads 119-1 to 119-6 may be greater than the area of a light emitting surface of each of the light emitting devices 114-1 to 114-n.

A third distance d3 between the dummy pads 119-1 to 119-6 and the second region 112b may be 14 mm or more. The reason why the third distance d3 is 14 mm or more is to prevent diffusion of heat to the drive devices 116 by the dummy pads 119-1 to 119-6. For example, the third distance d3 may be a distance between the dummy pads 119-1 to 119-6 and pads (not shown) of the board 112 on which the drive devices 116 are mounted.

FIG. 10 is a table representing simulation results and test results indicating temperatures of light emitting devices 114, temperatures of condensers 116-3 and temperature differences ΔT between the light emitting devices 114 and the condensers 116-3 according to change of diameters of cores.

Here, REF indicates temperature simulation results of an illumination apparatus including a heat dissipation member not provided with a core, and a board including a metal PCB. Here, a condenser temperature may be the highest temperature out of temperatures of the first and second condensers 116-3, and a temperature difference ΔT may be the smallest one out of a temperature difference between the light emitting devices 114 and the first condenser 116-3 and a temperature difference between the light emitting devices 114 and the second condensers 116-3.

Case 1 is the case that the diameter D2 of a core 122b is 25 mm, Case 2 is the case that the diameter D2 of the core 122b is 30 mm, and Case 3 is the case that the diameter D2 of the core 122b is 40 mm.

In Case 1 to Case 3, a first part 130A of a housing 130 is an aluminum mold casting formed integrally with a heat dissipation member 120, a second part 130B of the housing 130 is formed of plastic, a board 112 is a printed circuit board including FR4, the diameter D1 of a first region 112a of the board 112 is 30 mm, the heat dissipation member 120 is formed of aluminum, the thickness T1 of the core 122b is 5 mm, the thickness of heat dissipation fins 122c is 3 mm, the height of the heat dissipation fins 122c is 5 mm, and the number of the heat dissipation fins 122c is 20. Cases 1 to 4 indicate simulation results.

With reference to FIG. 10, the condenser temperatures in Cases 1 to 3 are lower than the condenser temperature in REF in which no core 122b is provided. The condenser temperature in REF is 74.72° C.

If the diameter D2 of the core 122b is 25 mm, the condenser temperature is 53.84° C.

If the diameter D2 of the core 122b is 30 mm, the condenser temperature is 53.85° C.

If the diameter D2 of the core 122b is 40 mm, the condenser temperature is 53.89° C.

For example, in order to maintain a condenser temperature of less than 54° C., the diameter D2 of the core 122b may be 25 mm to 40 mm.

A ratio (D2/D1) of the diameter D2 of the core 122b to the diameter D1 of the first region 112a of the board 112 may be 5/7 to 8/5. For example, D2/D1 may be 5/6 to 4/3.

For example, if D2/D1 is less than 5/6 or more than 4/3, the condenser temperature may be 54° C. or more and thus the lifetime of the condensers 116-3 may be shortened by heat.

Case 4 represents temperature simulation results of an illumination apparatus including the light emitting module 110-1 shown in FIG. 9, the distance between the dummy pads 119-1 to 119-6 and the condensers 116-3 is 14 mm, the housing 130 is an aluminum mold casting, the diameter D2 of the core 122b is 30 mm, the board 112 is a printed circuit board including FR4, the diameter D1 of the first region 112a of the board 112 is 30 mm, the heat dissipation member 120 is formed of aluminum, the thickness T1 of the core 122b is 5 mm, the thickness of the heat dissipation fins 122c is 3 mm, the height of the heat dissipation fins 122c is 5 mm, and the number of the heat dissipation fins 122c is 20.

Since, in case 4, heat is dissipated by the dummy pads 119-1 to 119-66 disposed around the light emitting devices 114-1 to 114-n, the condenser temperature is lowered, as compared to Case 1 to Case 3. That is, the condenser temperature of Case 4 is 48.38° C. which is lowered by about 5° C., as compared to the condenser temperature of Case 3. Therefore, the dummy pads 119-1 to 119-6 suppress transfer of heat generated from the light emitting devices 114-1 to 114-n to the drive devices 116 and improves heat dissipation efficiency, thereby preventing increase in the temperature of the drive devices 116 and thus preventing damage to the drive devices 116 due to heat.

Case 5 represents test results of Case 2, and FIG. 11 is a table representing test results of Case 4 of FIG. 10.

Ts1 indicates a surface temperature of any one of the light emitting devices 114-1 to 114-n, and Ts2 indicates a surface temperature of another one of the light emitting devices 114-1 to 114-n.

L1 and L2 indicate temperatures of inductors, BR1 indicates a temperature of the bridge diode 116-1, L3 coil indicates a temperature of a coil of the voltage converter 116-2, L3 core indicates a temperature of an iron core of the voltage converter 116-2, ZD1 indicates a temperature of the output diode, C9 and C10 indicate temperatures of the condensers 116-3, U1 indicates a temperature of the driver IC, D/P indicates a temperature of the diffusion plate 140, Tc1 indicates a temperature of the core 122b, Tc2 indicates a temperature of the side surface of the housing 130, and Q1 indicates a temperature of the FET.

When operating voltage is 120 V and power consumption is 10.86 W, the surface temperature of the light emitting device 114 is 68.2° C. and the temperature of the condenser 116-3 is 46.6° C. Here, the surface temperature of the light emitting device 114 may be the highest temperature out of the measured temperatures of the light emitting devices 114-1 to 114-n.

Case 6 represents temperature simulation results of the illumination apparatus 100 including the housing 130 formed of plastic, shown in FIG. 1. The first part 130A and the second parts 130B of the housing are formed of plastic, the diameter D2 of the core 122b is 30 mm, the board 112 is a printed circuit board including FR4, the diameter D1 of the first region 112a of the board 112 is 30 mm, the heat dissipation member 120 is formed of aluminum, the thickness T1 of the core 122b is 5 mm, the thickness of the heat dissipation fins 122c is 3 mm, the height of the heat dissipation fins 122c is 5 mm, and the number of the heat dissipation fins 122c is 20.

FIG. 12 is a table representing test results of Case 6 of FIG. 10.

With reference to FIG. 12, when operating voltage is 120 V and AC power consumption of is 10.86 W, the surface temperature of the light emitting device 114 is 77.5° C. and the temperature of the condenser 116-3 is 53.4° C. As compared with Case 5, the surface temperature of the light emitting device 114 of Case 6 is raised by 9.3° C. and the temperature of the condenser 116-3 of Case 6 is raised by 6.8° C., but the temperature of the condenser 116-3 of Case 6 is less than 54° C. and thus damage to the condenser 116-3 due to heat may be prevented and the lifetime of the condenser 116-3 may be improved.

The lifetime of the drive devices 116 may be influenced by the surface temperature of the drive devices 116 and a difference between the surface temperature of the drive devices 116 and ambient temperature around the illumination apparatus 100. If the surface temperature of the drive devices 116 is high, the lifetime of the drive devices 116 may be shortened. Particularly, the condenser 116-3 is weak to heat and the lifetime thereof may thus be shortened by heat received from the light emitting devices 114-1 to 114-n.

In Case 1 to Case 6, when the light emitting devices 114-1 to 114-n emit light, the temperature of the drive devices 116, particularly, the temperature of the condensers 116-3 may be maintained to be lower than 54° C. and thus the lifetime of the drive devices 116 may be improved.

Further, in Case 4 to Case 6, the temperature of the condensers 116-3 may be maintained to be lower than 80° C. and thus the lifetime of the drive devices 116 may be further improved.

As is apparent from the above description, an illumination apparatus in accordance with one embodiment may prevent lifetime of drive devices from being shortened due to heat generated from light emitting devices.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An illumination apparatus comprising:
a light emitting module including a board, a plurality of light emitting devices disposed in a first region of the board, and drive devices disposed in a second region of the board so as to drive the plurality of light emitting devices;
a heat dissipation member disposed on a lower surface of the board; and
dummy pads disposed in the first region of the board around the plurality of light emitting devices,
wherein the heat dissipation member includes:
a base corresponding to the lower surface of the board;
a core connected to a lower surface of the base; and
heat dissipation fins connected to a side surface of the core and the lower surface of the base,
wherein the first region is one region of an upper surface of the board corresponding to the core, including a center of the upper surface of the board and located within a designated range from the center of the upper surface of the board, and the second region is another region of the upper surface of the board, spaced apart from the first region by a first distance and spaced apart from an edge of the upper surface of the board by a second distance,
wherein a diameter of the core is equal to or greater than a diameter of the first region, and
wherein the dummy pads are disposed in a portion of the first region corresponding to the core.

2. The illumination apparatus according to claim 1, wherein the dummy pads surround outermost light emitting devices out of the plurality of light emitting devices.

3. The illumination apparatus according to claim 2, wherein the dummy pads are disposed both in the first region of the board and in a region located between the first region and the second region of the board.

4. The illumination apparatus according to claim 2, wherein a distance between the dummy pads and the second region of the board is 14 mm or more.

5. The illumination apparatus according to claim 2, wherein the first distance is greater than the second distance.

6. The illumination apparatus according to claim 2, wherein an area of each of the dummy pads is greater than an area of a light emitting surface of each of the plurality of light emitting devices.

7. The illumination apparatus according to claim 2, wherein:
the board includes pads to dispose the plurality of light emitting devices thereon; and
the dummy pads contact the pads.

8. The illumination apparatus according to claim 2, wherein:
the board includes pads to dispose the plurality of light emitting devices thereon; and
the dummy pads are separated from the pads.

9. The illumination apparatus according to claim 1, wherein a ratio of a diameter of the core to a diameter of the first region of the board is 5/6 to 4/3.

10. The illumination apparatus according to claim 1, further comprising:
a heat dissipation pad disposed between the lower surface of the board and the base of the heat dissipation member; and
a housing configured to receive the light emitting module and the heat dissipation pad.

11. The illumination apparatus according to claim 10, wherein the housing includes a first opening corresponding to the first region of the board, a second opening configured to emit light generated from the plurality of light emitting devices, and a reflective part including a reflective surface located between the first opening and the second opening, and wherein the reflective surface is located between the drive devices and the plurality of light emitting devices.

12. The illumination apparatus according to claim 11, further comprising a diffusion plate disposed on the second opening.

13. The illumination apparatus according to claim 10, wherein:

an upper surface of the base includes a first region corresponding to the board such that the board is disposed thereon, and a second region configured to surround the first region;

through holes provided in the second region of the base; and coupling members passing through the through holes and combined with a lower end of the housing.

14. The illumination apparatus according to claim 1, wherein a center of the core is aligned with a center of the first region of the board.

15. The illumination apparatus according to claim 14, wherein the center of the core is aligned with a center of the base.

16. The illumination apparatus according to claim 1, wherein one end of each of the heat dissipation fins is connected to the side surface of the core, and the other end of each of the heat dissipation fins extends to an edge of the lower surface of the base.

17. The illumination apparatus according to claim 16, wherein a thickness of the core is greater than a thickness of the base.

18. The illumination apparatus according to claim 1, wherein the dummy pads are disposed between the plurality of light emitting devices disposed at an outermost area of the first region and an outermost line of the first region, and wherein the second region has a circular ring shape with a predetermined width and surrounding the first region.

19. An illumination apparatus comprising:

a light emitting module including a board, light emitting devices disposed in a first region of the board, drive devices disposed in a second region of the board so as to drive the light emitting devices, and dummy pads disposed in the first region of the board between the light emitting devices and the drive devices;

a heat dissipation member including a base provided with an upper surface contacting a lower surface of the board, a core connected to a lower surface of the base, and heat dissipation fins connected to a side surface of the core and the lower surface of the base;

a heat dissipation pad disposed between the lower surface of the board and the base; and a housing configured to receive the light emitting module and the heat dissipation pad, wherein:

the dummy pads surround outermost light emitting devices out of the light emitting devices; and the first region is one region of the upper surface of the board corresponding to the core, including the center of the upper surface of the board and located within a designated range from the center of the board, and the second region is another region of the upper surface of the board, spaced apart from the first region and an edge of the upper surface of the board, wherein a diameter of the core is equal to or greater than a diameter of the first region, and wherein the dummy pads are disposed in a portion of the first region corresponding to the core.

20. The illumination apparatus according to claim 19, wherein the dummy pads are disposed between the plurality of light emitting devices disposed at an outermost area of the first region and an outermost line of the first region, and wherein the second region has a circular ring shape with a predetermined width and surrounding the first region.

\* \* \* \* \*